US009316679B2

(12) United States Patent
Sun

(10) Patent No.: US 9,316,679 B2
(45) Date of Patent: Apr. 19, 2016

(54) METHOD FOR LOCATING OF SINGLE-PHASE-TO-GROUND FAULTS OF UNGROUNDED POWER DISTRIBUTION SYSTEMS

(71) Applicant: Mitsubishi Electric Research Laboratories, Inc., Cambridge, MA (US)

(72) Inventor: Hongbo Sun, Plymouth, MN (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 472 days.

(21) Appl. No.: 13/860,154

(22) Filed: Apr. 10, 2013

(65) Prior Publication Data

US 2014/0309953 A1    Oct. 16, 2014

(51) Int. Cl.
*G01R 31/00* (2006.01)
*G01R 31/08* (2006.01)
*G01R 31/02* (2006.01)
*G06F 19/00* (2011.01)

(52) U.S. Cl.
CPC .............. *G01R 31/08* (2013.01); *G01R 31/025* (2013.01)

(58) Field of Classification Search
CPC ...... G01R 31/08; G01R 31/086; G01R 31/025
See application file for complete search history.

(56) References Cited

U.S. PATENT DOCUMENTS 6,721,671 B2 * 4/2004 Roberts ................ G01R 31/025
324/509
2012/0004867 A1 * 1/2012 Mousavi ............ G01R 31/3274
702/58

* cited by examiner

*Primary Examiner* — Phuong Huynh
(74) *Attorney, Agent, or Firm* — Dirk Brikman; Gene Vinokur

(57) ABSTRACT

The method determines shunt caused residual voltages and fault caused residual voltages on the upstream bus and the downstream bus of the line segment within a faulty feeder section of a faulty feeder. The line segment is designated as a faulty line segment when a reference angle of a faulty phase is between a first angle of a difference between an angle of the fault caused residual voltage and an angle of the shunt caused residual voltage on the upstream bus and a second angle of a difference between an angle of the fault caused residual voltage and an angle of the shunt caused residual voltage on the downstream bus. The location of the fault is determined at a point on the faulty line segment with a difference between the angles of the fault and the shunt caused residual voltages in phase with the reference angle.

18 Claims, 11 Drawing Sheets

100

200

300

400

500

900

METHOD FOR LOCATING OF SINGLE-PHASE-TO-GROUND FAULTS OF UNGROUNDED POWER DISTRIBUTION SYSTEMS

FIELD OF THE INVENTION

The present invention relates generally to power distribution systems, and more particularly to detecting and locating of a fault in the ungrounded power distribution systems.

BACKGROUND OF THE INVENTION

Ungrounded power distribution systems are widely used, especially at medium voltage levels, e.g., less than 50 kV. Compared with the grounded distribution systems, the ungrounded systems do not have neural wires to connect with the ground, and they are connected to ground through phase-to-ground capacitances of power lines. When a single-phase-to-ground fault occurs, the fault currents of ungrounded distribution systems are less than normal load currents, thus the system can continue to operate until the fault is corrected.

However, as a result of the fault, the power lines of the distribution systems experience over-voltages, which can damage the lines when the fault is not corrected in a timely manner. Thus, detecting and locating of a fault is important for the safe and stable operation of ungrounded distribution systems.

Several methods have been used for locating single-phase-to-ground faults in ungrounded distribution systems. For example, a method described in U.S. Pat. No. 6,721,671 for determining a section of the system having a fault uses a directional element to determine faults on ungrounded power systems, which following enablement under selected input current conditions, determined zero sequence impedance, in response to values of zero sequence voltage and zero sequence current.

Another method, described in US 2003/0085715, introduces a measurement signal having a measurement frequency on the line having a fault. The fault location is determined for a selected segment based on a measured residual current corresponding to the measurement signal, and a predetermined relative impedance of the power distribution, system. However, usage of additional frequency measurements is not optimal for some applications.

Accordingly, there is a need for determining locations of single-phase-to-ground faults in the ungrounded power distribution systems.

SUMMARY OF THE INVENTION

Various embodiments of invention determine the location of a bolted single-phase-to-ground fault in an ungrounded power distribution system based on measurements collected during the fault. For example, the measurements can be determined by the measuring units or sensors installed at the feeder breakers and switches.

Some embodiments are based on a realization that a possible faulty area can be narrowed down into a small section of a feeder if multiple measuring devices are used for feeders in a substation. Some embodiments of the invention uses the measurements collected from the feeder breakers at the roots of feeders, and switches with sensors along the feeders. In some embodiments of the invention, the faulty phase, faulty feeder and faulty feeder section are first determined based on the voltage and current measurements during, the fault, and then the possible faulty line segment and faulty location are determined by detailed analysis of voltage and current distribution in the faulty feeder section.

A faulty line segment can be determined by comparing angle of the phase-to-ground voltage of the faulty phase against a reference angle of the faulty phase if assuming that the fault current flows across the line segment instead of entering into ground through a location within the line segment. If the value of the reference angle of the faulty phase is between the angles of the voltages on the bus terminals forming the line segment, i.e., an upstream bus and a downstream bus, then this line segment is faulty. However, in order to determine the voltage on the buses, the loads of the buses should be determined, which can be a difficult task. Thus, it is desired to avoid the determination of the loads.

Some embodiments are based on a realization that a difference between the fault caused residual voltage and the shunt caused residual voltage of the bus can approximate the voltage on the faulty phase of the bus. The fault caused residual voltage is a sum of the voltages of all three phases at the time of the fault determined under assumption that the current flows across the line segment. This assumption leads to a change of sign of the difference between the angle of the voltage on the downstream bus and a reference angle of the faulty phase comparing to a voltage on the upstream bus of the faulty line.

A shunt caused residual voltage is a sum of the voltages of all three phases without fault determined based on shunt current, i.e., without the fault current. Thus, the difference between the fault caused residual voltage and the shunt caused residual can approximate the voltage of the faulty phase, but because those voltages includes sum of the voltages of the phases, and the loads are DELTA-connected, the loads of different phases cancel each other and thus do not have to be determined. Accordingly, determination of the faulty line is simplified.

Moreover, the difference between the fault caused residual voltage and the shunt caused residual voltage at the location of the fault is in phase with a reference angle of the faulty phase. Thus, various location of the faulty line segment can be tested with this equality to determine the location of the fault.

Some embodiments are based on another realization that the variations of residual voltages upstream and downstream to the faulty location shows different patterns due to the direction change of residual currents around the fault location, so some embodiments of the invention determine the fault location based on the variations of residual voltages along the line segments. Some embodiments of the invention defines two types of residual voltages, one is called shunt caused residual voltages which is used to describe the residual voltage distribution of the feeder section under an un-faulty condition with given measured voltages at the boundaries of the feeder section, and the other is called the fault caused residual voltages which are used to describe the residual voltage distribution under a faulty condition that occurred downstream to the location of interest. The faulty line segment is identified when the phase angles of the difference between two residual voltages determined at two terminal buses of a line segment are at different sides of the faulty phase based reference axis. The fault location is determined by finding a location along the faulty line that the phase angle of difference of two residual voltages are in phase with the reference angle.

Yet another realization that sonic embodiments of the invention are based upon is that the residual currents and residual voltages are dominantly caused by the shunt admittances of line segments for an ungrounded distribution system when the asymmetry of distribution lines is ignored, thus some embodiments of the invention determines the fault location solely based on the voltage and current measurements during the fault, and series impedance and shunt admittances of line segments in the feeder sections. Some embodiments of the invention do not use any information or measurements regarding the load demands of the system, or the pre-fault conditions in the system. By doing so, the efforts for measurement collecting and processing are significantly reduced.

Accordingly, one embodiment discloses a method for determining a location of a fault in an ungrounded power distribution system, wherein the power distribution system includes a set of feeders connected to a substation, wherein each feeder includes a set of loads connected by line segments and each line segment includes an upstream bus and a downstream bus, and the fault is a bolted single-phase-to-ground fault. The method included determining shunt caused residual voltages on the upstream bus and the downstream bus of the line segment within a faulty feeder section of a faulty feeder; determining fault caused residual voltages on the upstream bus and the downstream bus of the line segment; designating the line segment as a faulty line, segment when a reference angle of a faulty phase is between a first angle of a difference between an angle of the fault caused residual voltage and an angle of the shunt caused residual voltage on the upstream bus and a second angle of a difference between an angle of the fault caused residual voltage and an angle of the shunt caused residual voltage on the downstream bus; and determining a location of a point on the faulty line segment with a difference between the angle of the fault caused residual voltage and the angle of the shunt caused residual voltage in phase with the reference angle of the faulty phase as the location of the fault. The steps of the method can be performed by a processor.

Another embodiment discloses a system for determining a location of a fault in an ungrounded power distribution system, wherein the power distribution system includes a set of feeders connected to a substation, wherein each feeder includes a set of loads connected by line segments and each line segment includes an upstream bus and a downstream bus, and the fault is a bolted single-phase-to-ground fault. The system includes a processor for determining, shunt caused residual voltages on the upstream bus and the downstream bus of the line segment within a faulty feeder section of a faulty feeder; determining fault caused residual voltages on the upstream bus and the downstream bus of the line segment; determining a faulty line segment as a line segment with a value of a reference angle of a faulty phase between a first angle and a second angle, wherein the first angle equals a difference between an angle of the fault caused residual voltage and an angle of the shunt caused residual voltage on the upstream bus, and Wherein the second angle equals a difference between an angle of the fault caused residual voltage and an angle of the shunt caused residual voltage on the downstream bus; and determining a location of a point on the faulty line segment with a difference between the angle of the fault caused residual voltage and the angle of shunt caused residual voltage in phase with the reference angle of the faulty phase as the location of the fault.

DETAILED DESCRIPTION OF THE PREFERRED EMBODIMENTS

Ungrounded Distribution System and Fault Locating

Figure 1:
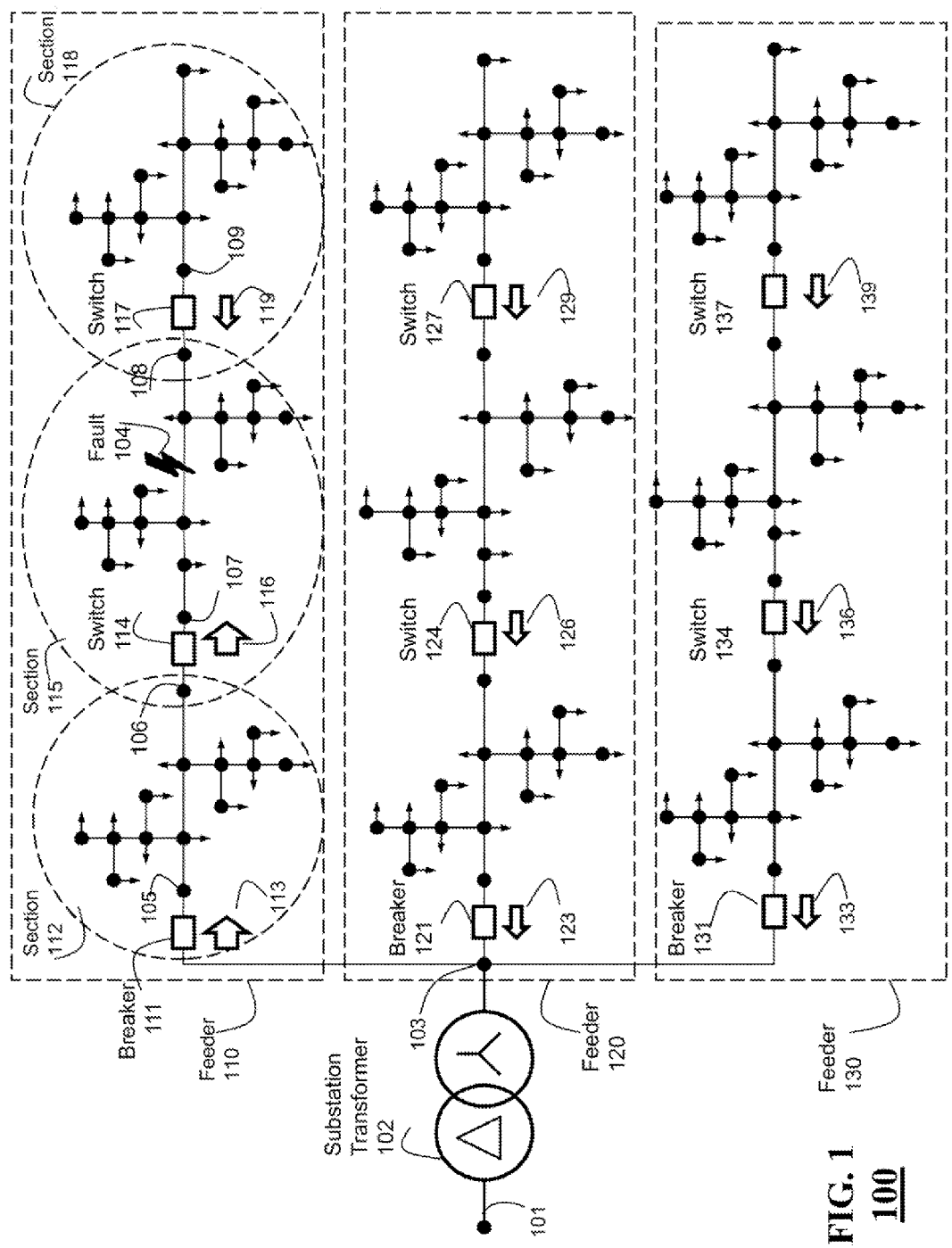
FIG. 1 is a schematic of an exemplar ungrounded distribution system.

FIG. 1 shows an example of ungrounded distribution system with a single-phase-to-ground fault 104. The distribution system includes a distribution substation in which a three-phase transformer 102 receives electric power from power transmission systems, and provides the power to downstream feeders via an upstream bus 101 and a downstream bus 103 connected to the transformer 102.

The windings of the transformer 102 are ungrounded, either using WYE or DELTA connection. For example, in the FIG. 1, the primary winding of the transformer uses the DELTA connection, and secondary winding uses WYE connection. The feeder transfers powers to the loads through three-phase three-wire lines. All loads can be DELTA connected. Each feeder can have several switchable and measured devices, and measuring units attached to those devices can provide three-phase voltage and three-phase current measurements.

In the example of FIG. 1, the transformer 102 is connected to three feeders, a feeder 110, a feeder 120 and a feeder 130. Each feeder can include one feeder breaker at its root, e.g., breakers 111, 121, and 131. The feeders can also include switches defining sections of the feeders. For example, the feeder 110 includes a switch 114 and a switch 117. The feeder 120 includes a switch 124 and a switch 127. The feeder 130 includes a switch 134 and a switch 137. The switchers can include sensors for measuring voltages, currents or both.

Distribution networks are typically of two types, radial or interconnected. The distribution system 100 operates radially, i.e., power leaves the station and passes through the network area with no connection to any other power supply.

According to the location of switchable and measured devices, a feeder can be partitioned into several feeder sections. Each feeder section can have one importing measuring device at the root of the section for providing power to this section, and several exporting measuring devices at the downstream boundaries of the section for providing power to subsequent feeder sections. All line segments or devices between the importing and the exporting measuring devices are part of the feeder section.

For example, the feeder 110 can be partitioned into three feeder sections, section 112, section 115, and section 118. The feeder section 112 includes all the line segments or devices between the upstream bus 103 of breaker 111, and upstream bus 106 of switch 114, and includes one importing measuring device located at breaker 111, and one exporting measuring device located at switch 114. The section 115 is defined by all the line segments or devices between the upstream bus 106 of switch 114, and upstream bus 108 of switch 117, and includes one importing measuring device located at switch 114, and one exporting measuring device located at switch 117. The feeder section 118 is defined as all line segments or devices downstream to the upstream bus 108 of switch 117, and includes one importing measuring device located at switch 117. Feeder section 118 does not have any exporting measuring device.

The buses of a feeder sections can be partitioned into several layers according to the number of devices connected between each bus and the upstream bus of importing measuring device.

Figure 3:
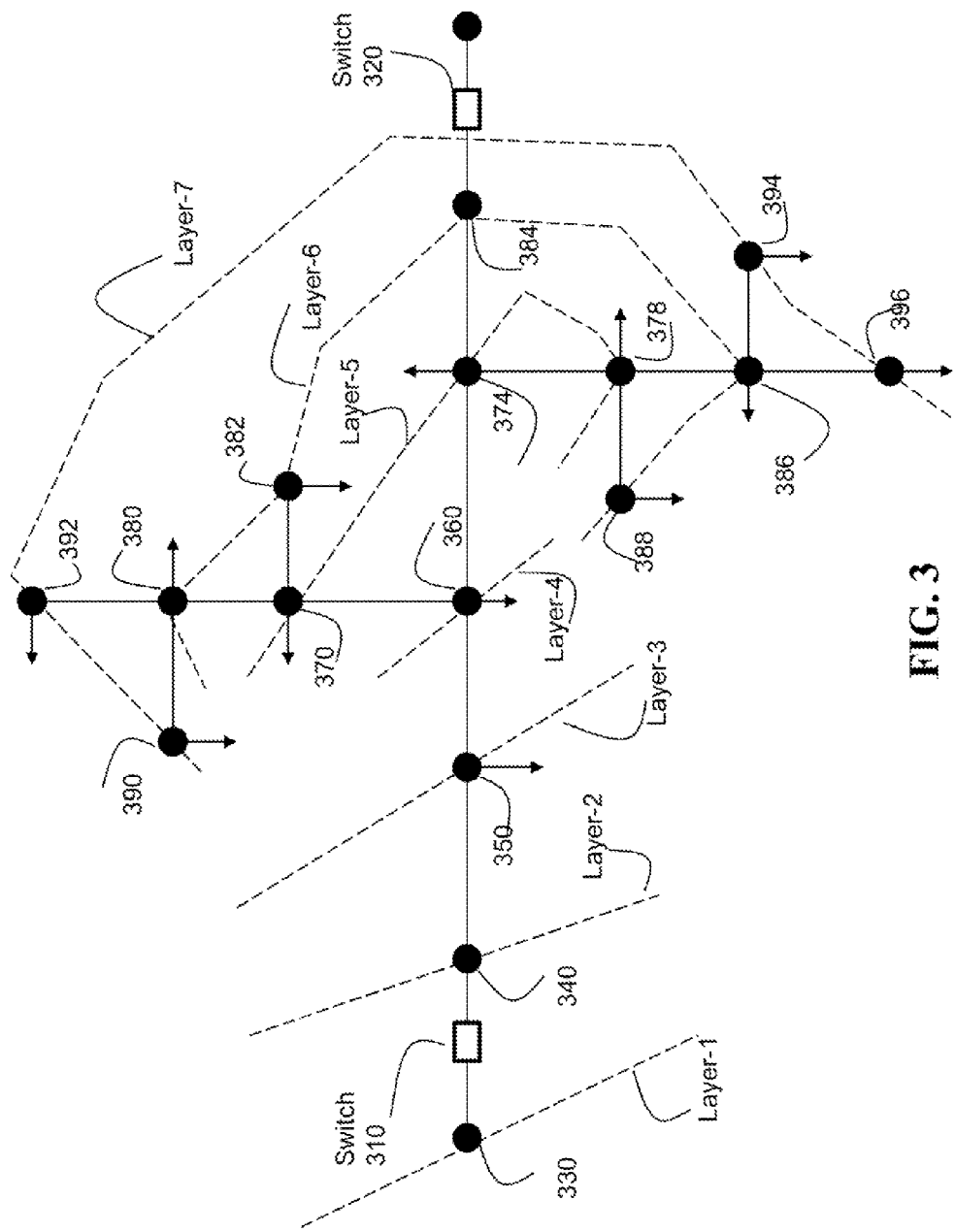
FIG. 3 is a schematic ala feeder section, with a breaker or switch with sensor as an importing measuring device, and multiple switches with sensors as exporting measuring devices.
Figure 4:
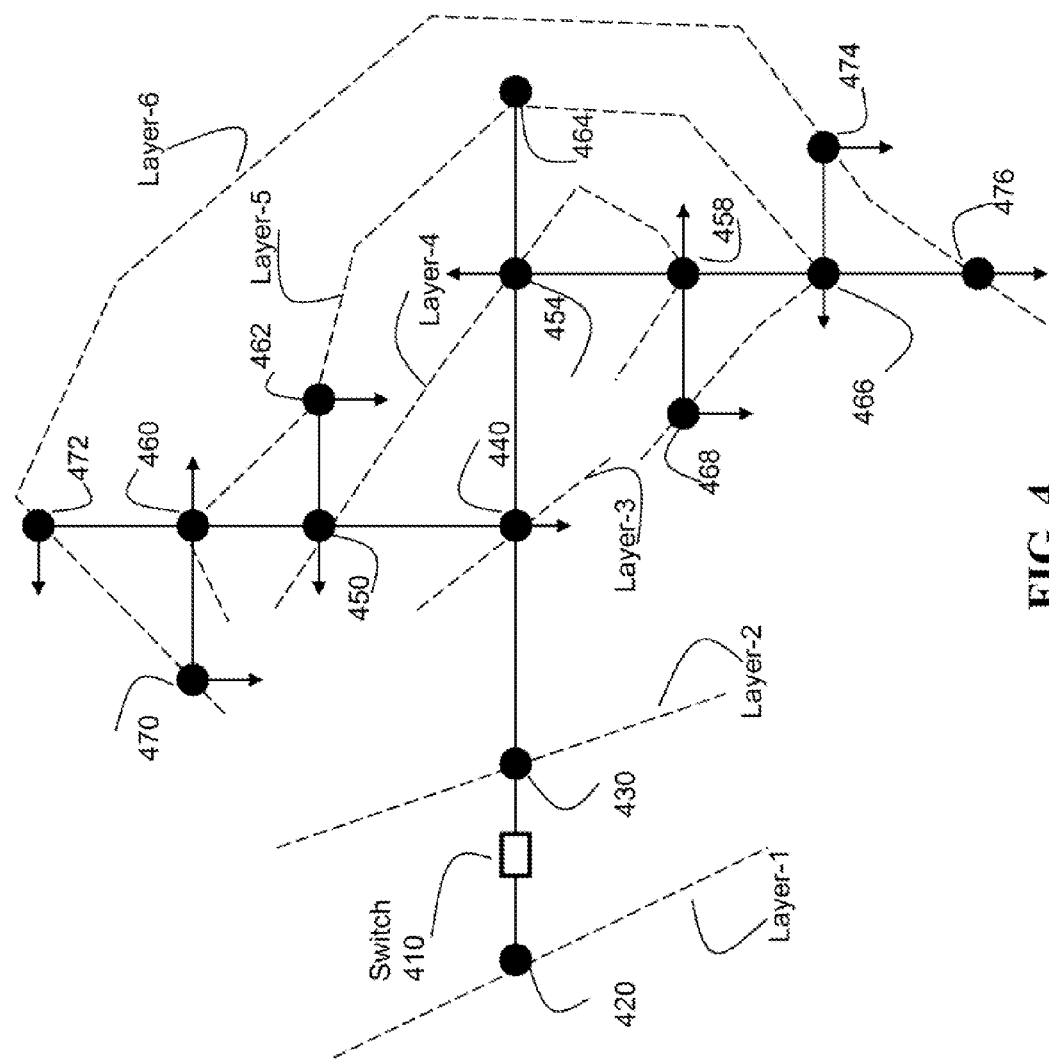
FIG. 4 is a schematic of a feeder section with a breaker or switch with sensor as an importing measuring device.

FIG. 3 and FIG. 4 show two examples of feeder sections with different measuring conditions. FIG. 3 is a schematic of a feeder section 300 that has multiple measuring devices at its boundaries. The feeder section 300 has one importing measuring device at switch 310, and one exporting measuring device at switch 320. FIG. 4 is a schematic of a feeder section 400 that has only one measuring device, importing measuring device at switch 410.

The feeder section shown in FIG. 3 includes seven layers. Layers 1, 2, 3, and 4 have one bus each. Layer 1 includes the bus 330 which is the upstream bus of importing measuring device. Layer 2, 3 and 4 includes the buses 340, 350 and 360 respectively. Layer 5 includes the buses 370, 374 and 378. Layer 6 and layer 7 have four buses each. Layer 6 includes the buses 380, 382, 384, and 386. Layer 7 includes the buses 390, 392, 394, and 396. The upstream bus of exporting measuring device, 384 is included in the layer 6.

Figure 2:
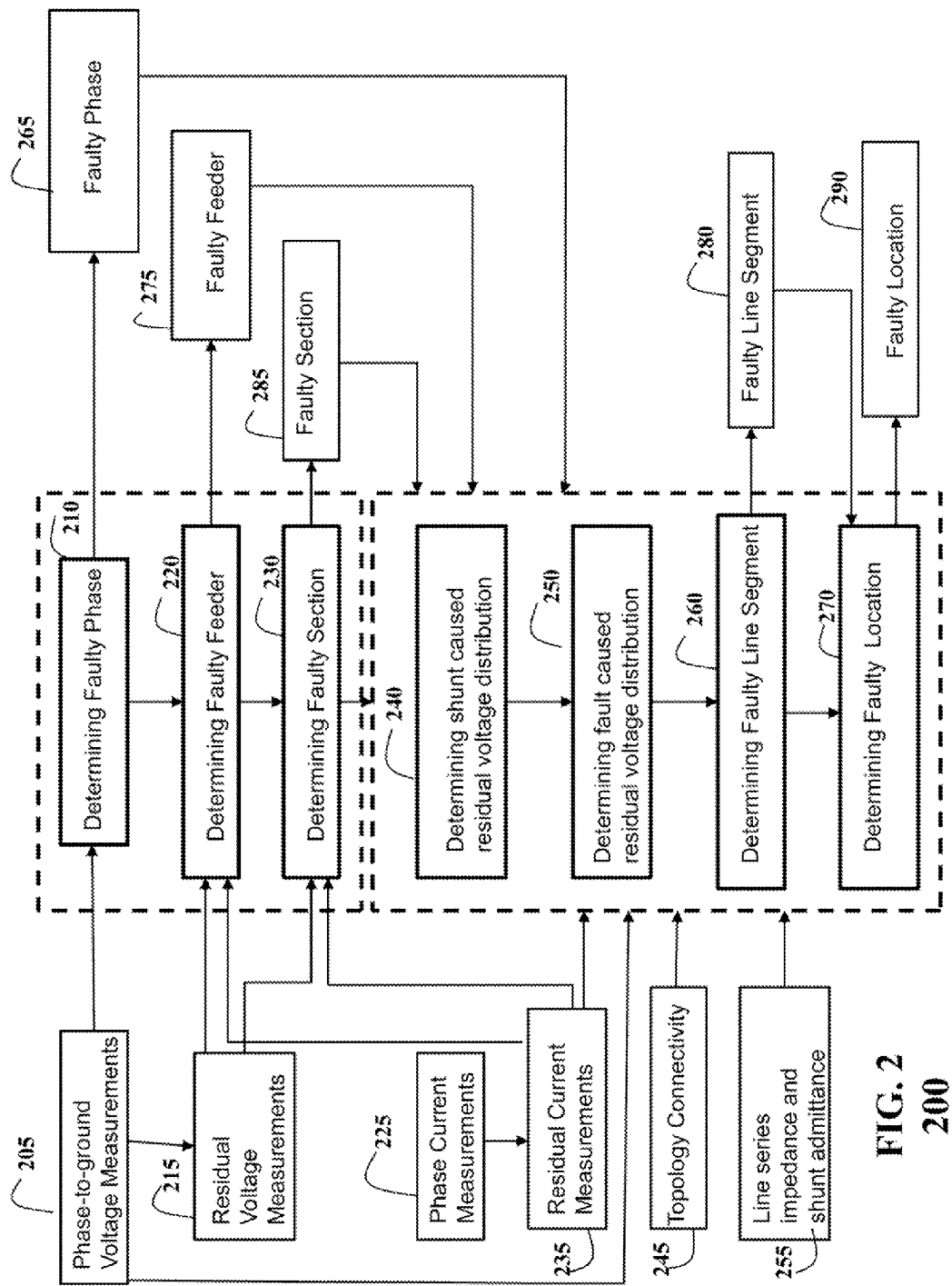
FIG. 2 is a block diagram of a method for locating the single-phase-to-ground faults of ungrounded systems according to some embodiments of invention.

The feeder section shown in the FIG. 4 can be partitioned into 6 layers. Layer 1 includes one bus 420, the upstream bus of importing measuring device 410. Layer 2 and 3 also have one bus each, bus 430, and 440 respectively. Layer 4 has 3 buses, including bus 450, 454 and 458. Layer 5 and layer six have four buses each. Layer 5 contains bus 460, 462, 464, and 466. Layer 6 contains buses 470, 472, 474, and 476, FIG. 2 shows a block diagram of a method 200 for locating a single-phase-to-ground fault in an ungrounded distribution system. Steps of the method can be implemented using a processor, connected to a memory and input output interfaces as known in the art.

The faulty phase 265 is determined 210 based on the phase-to-ground voltage measurements 205. Then, the possible faulty area is narrowed down 220 and 230 to a specific feeder 275, and a specific feeder section 285, based on the residual voltage measurements 215 and residual current measurements 235. The residual voltages and residual currents may be measured directly or derived from phase-to-ground voltage measurements 205, and phase current measurements 225.

After the faulty phase and faulty feeder section are known, the shunt caused residual voltage distribution, and fault caused residual voltage distribution Within the faulty feeder section are determined (240 and 250) by using the phase-to-ground voltage measurements 205, residual current measurements 235, system topology connectivity model 245, and series impedance and shunt admittance models 255 of line segments.

Based those two types of residual voltage distribution within the faulty feeder section, the fault location is further limited 260 to one or several specific line segments 280 based on the topology connectivity model 245, and the line impedance and admittance models 255. For each possible faulty line segment, a possible faulty location 290 is determined, 270 by testing a phase angle of residual voltage difference at a location along the segment with the reference angle of the faulty phase. As commonly used in the art, and in this description, an angle of the voltage is a phase angle of the voltage.

A faulty line can be determined by comparing the angles of the voltage of the faulty phase with a faulty phase reference angle if assuming that the fault currents flow across the line segment instead of entering into the ground through a location within the line segment. If the value of the reference angle of the faulty phase is between the angles of the voltages on the bus terminals forming the line segment, i.e., an upstream bus and a downstream bus, then this line segment is faulty. However, to determine the voltage on the buses, the load of the buses should be determined, which can be a difficult task. Thus, it is desired to avoid the determination of the loads.

Some embodiments are based on a realization that a difference between the fault caused residual voltage and the shunt caused residual voltage of the bus can approximate the voltage on the faulty phase of the bus. The fault caused residual voltage is a sum of the voltages of all three phases at the time of the fault determined under assumption that the current flows across the line segment. This assumption leads to a change of sign of the difference between the angle of the voltage on the downstream bus and a reference angle of the faulty phase comparing to a voltage on the upstream bus of the faulty line.

A shunt caused residual voltage is a sum of the voltages of all three phases without fault determined based on shunt current, i.e., without the fault current. Thus, the difference between the fault caused residual voltage and the shunt caused residual can approximate the voltage of the faulty phase. Because those voltages includes sum of the voltages of the phases, and the loads are DELTA-connected, the loads of different phases cancel each other and thus do not have to be determined. Accordingly, determination of the faulty line is simplified.

The difference between the fault caused residual voltage and the shunt caused residual voltage at the location of the fault is in phase with a reference angle of the faulty phase. Thus, various location of the faulty line segment can be tested with this equality to determine the location of the fault.

The measurements used in some embodiments of the invention are a steady-state power frequency components of voltage and current measurements collected during the fault. Each measurement is described by its magnitude, and phase angle. If the instantaneous waveforms are provided instead of steady-state values at power frequency, then a least-square regression method may be applied to extract the required power frequency components from the instantaneous voltage and current measurements. The measurements collected from the measuring units of a feeder breaker or switch with sensor include the currents flowing through the device downstream on phase a, b and c, $I_{ps,a}$, $I_{ps,b}$ and $I_{ps,c}$, and the phase-to-ground voltages on phase a b and c, $V_{p,a}$, $V_{p,b}$ and $V_{p,c}$, where bus p and s are the terminal buses of the breaker or switch, and bus p is upstream to bus s. Taken breaker 111 in FIG. 1 as an example, the measurements include three-phase voltages measured at its upstream bus 103, and three-phase currents flowing through the breaker from its upstream bus 103 towards its downstream bus 105.

Based on the measured phase-to-ground voltages and phase currents, the residual voltages and residual currents can be determined if not measured directly, according to:

$$v_p^{res} = V_{p,a} + V_{p,b} + V_{p,c}, \quad (1)$$

$$i_{ps}^{res} = I_{ps,a} + I_{ps,b} + I_{ps,c}, \quad (2)$$

where, $v_p^{res}$ is the residual voltage at bus p, $i_{ps}^{res}$ is the residual current flowing from bus p to bus s and measured at bus p.

Determination of Faulty Phase, Faulty Feeder and Faulty Section

The faulty phase is determined based on the measured phase-to-ground voltages at the substation during the fault. During normal operation, the three phase-to-ground voltages are close to be balanced, that is, the normalized magnitudes of voltages are close to 1.0 per unit. When a bolted single-phase-to-ground fault occurs at a feeder, the phase-to-ground voltage of the faulty phase of the faulty feeder, and adjacent feeders that connected to the same substation transformer instantaneously approaches zero. On the other hand, due to the ungrounded connection of the transformer, the substation maintains the phase-to-phase voltage close to unchanged, and then the phase-to-ground voltages of the other two un-faulty phase instantaneously increases to values close to 1.73 times of its normal operation.

The phase-to-ground voltages measured at the secondary side of the substation transformer. i.e., the upstream bus of feeder breakers can be used to determine the faulty phase for a bolted single-phase-ground fault. The phase x is determined as faulty phase, if the following conditions are met:

$$|V_{sub,x}| \le \underline{V} x \in \{a,b,c\} \quad (3)$$

$$|V_{sub,y}| \ge \overline{V} y \in \{a,b,c\}, y \ne x \quad (4)$$

where, $V_{sub,x}$ and $V_{sub,y}$ are the phase-to-ground voltage measured at the secondary side of the substation transformer on the phase x and y respectively, and $\underline{V}$ and $\overline{V}$ are the lower and upper thresholds of voltage magnitude used for abnormal voltage determination. For examples, $\underline{V}$ and $\overline{V}$ can be set as 0.30 per unit, and 1.40 per unit respectively.

The faulty feeder and faulty feeder section can be determined based on the angle difference between residual voltage, and residual currents at the measuring devices along the feeders. When the asymmetry of distribution power lines is ignored, the residual currents of an ungrounded distribution system are contributed, by the phase-to-ground capacities of un-faulty phases of the faulty and un-faulty feeders.

When a bolted single-phase-to-ground fault occurs at a location within a feeder, the residual voltage at the location increases to a value close to three times of normal phase-to-ground voltage of the faulty phase. The direction of residual currents at a location downstream to the faulty location, is flowing toward the substation, so the residual voltage leads the residual current by around 90 degree. The direction of residual current at a location upstream to the fault is flowing toward the faulty location and away from the substation, so the residual voltage is lagging the residual current by around 90 degree.

Taken the single-phase-to-ground fault 104 in FIG. 1 as example, the fault 104 is within the feeder section 115 of feeder 110. Based on the network topology, breaker 111 and switch 114 of feeder 110 are upstream to the fault, and switch 117 is downstream to the fault. The residual current of breaker 111 and switch 114 flows towards the faulty point, as shown by the directions of the hollow arrows 113 and 116. The residual current of switch 117 flows towards the substation as shown by the direction of hollow arrow 119. Similarly, the breakers and switches of feeder 120 and 130 are upstream to the faulty point, so the flow directions of residual currents through those devices are towards the substation as shown by the hollow arrows 123, 126, 129, 133, 136 and 139.

A feeder is determined as a faulty feeder, when the phase angle difference between the residual voltage and residual current measured at the feeder breaker are close to 90 degree. Eq. (5) is used to determine whether a feeder has a single-to-ground fault:

$$|\angle v_{fdr}^{res} - \angle i_{fdr}^{res} - 90°| < \Delta\overline{\theta}, \quad (5)$$

where, $\angle v_{fdr}^{res}$ is the phase angle of residual voltage measured at the upstream terminal bus of the feeder breaker, $\angle i_{fdr}^{res}$ is the phase angle of residual current flowing into the feeder breaker through its upstream terminal bus, $\Delta\overline{\theta}$ is a predetermined threshold of angle difference according to the ratio of shunt suceptance components over total shunt admittances of typical conductors used in the distribution systems. For example, one embodiment sets $\Delta\overline{\theta}$ as 20 degree.

In the example of FIG. 1, if Eq. (5) is satisfied at the breaker 111, and not satisfied at breaker 121 and breaker 131, then the fault is at feeder 110, and not at feeders 120 and 130.

The faulty section can be determined by checking the angle difference between the residual voltage and residual current of the measuring devices at the boundaries of the feeder section. For example, a feeder section can be determined to be a faulty feeder section when the angle difference between residual voltage $v_{im}^{res}$ and residual current $i_{im}^{res}$ at its importing measuring device are close to 90 degree, and the angle difference between residual voltage $v_{ex}^{res}$ and residual current $i_{ex}^{res}$ at one of its exporting measuring device is close to −90 degree, that is, the following conditions are satisfied:

$$|\angle v_{im}^{res} - \angle i_{im}^{res} - 90°| < \Delta\overline{\theta}, \quad (6)$$

$$|\angle v_{ex}^{res} - \angle i_{ex}^{res} + 90°| < \Delta\overline{\theta}, \quad (7)$$

If the magnitude of residual current at the importing measuring device is close to zero, then only the exporting measuring devices can be used to determine whether there is a fault within the section by using Eq. (7). For example, for a single-feeder substation, the residual current measured at the feeder breaker is close to zero, so only the measurements at the downstream switches are used. If a feeder section has only one importing measuring device, whether it is a faulty section is determined by only using the measurements at the importing measuring device using Eq. (6).

In FIG. 1, if the angle differences are close to 90 degree at the breaker 111 and switch 114, but −90 degree at the switch 117, then the fault is within the feeder section between switch 114 and switch 117, the feeder section 115 of feeder 110.

Determining Shunt Caused Residual Voltage Distribution

The shunt caused residual voltages are used to describe the residual voltage distribution of a feeder section with given measured voltages at the boundaries of the section if no fault occurs in the section.

The shunt caused residual voltage at bus p, $\hat{v}_p^{res}$ can be determined based on the phase-to-ground voltages at bus p, according to:

$$\hat{v}_p^{res} = \sum_{x \in \{a,b,c\}} \hat{V}_{p,x} \quad (8)$$

where $\hat{V}_{p,x}$ is the determined phase-to-ground voltages of phase x at bus p.

For a feeder section, the determined voltage distribution within the section can be determined based on the phase-toground voltage measurements at the importing and exporting measuring devices of the section and its topology connectivity.

The voltages at buses connected to the measuring devices in the feeder section are directly set as the measured values:

$$\hat{V}_{im} = V_{im}, \quad (9)$$

$$\hat{V}_{ex} = V_{ex}, \quad (10)$$

where, $\hat{V}_{im}$ and $V_{im}$ are the determined and measured phase-to-ground voltages at the a boundary bus of an importing measuring device im, $\hat{V}_{ex}$ and $V_{ex}$ the determined and measured phase-to-ground voltages at a boundary bus of the exporting measuring device X.

The phase-to-ground voltages of a bus residing in the connectivity path between each pair of the importing measuring device and one of the exporting measuring device are determined based on distances between the bus and two measuring devices and available voltage measurements at the two measuring devices. For example, the voltage of a bus residing on a path between the boundary buses of the two measuring devices can be determined as a weighted average of the voltages of the boundary buses weighted proportionally to relative distances between the bus on the path and the boundary buses.

For example, the phase-to-ground voltage of bus p can be determined according to:

$$\hat{V}_p = \frac{d_{p-ex}}{d_{im-p} + d_{p-ex}} V_{im} + \frac{d_{im-p}}{d_{im-p} + d_{p-ex}} V_{ex} \quad (11)$$

where, $\hat{V}_p$ is the vector of determined phase-to-ground voltages of bus p. $V_{im}$ and $V_{ex}$ are the vectors of phase-to-round voltages measured at the importing and exporting measuring devices, $d_{im-p}$ and $d_{p-ex}$ are the sum of length of line segments at the path between the bus and the upstream buses of importing device, and exporting device respectively.

If there are multiple exporting measuring devices for the feeder section, and common buses between different paths, then the voltages of those common buses can be set as the average of determined voltages for all paths:

$$\hat{V}_p = \frac{1}{m} \sum_{i=1}^{m} \left( \frac{d_{p-ex_i}}{d_{im-p} + d_{p-ex_i}} V_{im} + \frac{d_{im-p}}{d_{im-p} + d_{p-ex_i}} V_{ex_i} \right), \quad (12)$$

where, in is the total number of paths that pass through bus p, $V_{ex_i}$ is the measured voltage of i-th exporting measuring device $ex_i$, and $d_{p-ex_i}$ is the sum of length of line segments at the path between the bus p and the upstream bus s of the i-th exporting measuring device.

For any bus not on any paths between the measuring devices, but fed from one of buses in the paths, its voltage can be determined as the voltage of the feeding bus on the paths according to:

$$\hat{V}_s = \hat{V}_p, \quad (13)$$

where, bus s is a bus not in the paths, bus p is a bus in the paths, $\hat{V}_s$ is vector of the determined phase-to-ground voltages of bus s.

FIG. 3 shows an example of the feeder section having one importing measuring device at bus 330, and one exporting measuring device at 384. All buses on the path between the importing and exporting measuring devices, such as bus 340, 350, 360 and 374 are determined based on its distance to bus 330 and 384 and measured voltages at bus 330 and 384 according to Eq. (11). The voltages of all buses downstream bus 360, including, bus 370, 382, 390, 392 can be determined, the same as the voltage of bus 360. The voltages of all buses downstream bus 374, including bus 378, 386, 388, 394, and 396 can be determined the same as the determined voltage of bus 374.

For a feeder section with only one importing measuring device, all buses within the section can be set as the measured voltages at the importing measuring device. For example, in FIG. 4, the feeder section has only one importing measuring device at bus 420, the voltages of all buses in the section are set as the same as the voltages measured at bus 420.

Determining Shunt Caused Residual Current Distribution

If there is no fault in the feeder section, then the residual currents on each line segment in the feeder section are solely contributed by the shunt currents of line segments downstream to the importing measuring device of the feeder section. The shunt currents can be determined based on the determined voltages at the terminal buses of the associated line segments and shunt admittance of those segments. This type of residual currents is called shunt caused residual currents. Some embodiments ignore the asymmetry of the distribution lines in determining the shunt caused residual currents.

In some embodiments of the invention, the contributions of residual currents from each phase are modeled and solved independently. For a line segment between bus p and bus s, the residual current from bus p to bus s, $i_{ps}^{res}$ can be determined according to $$i_{ps}^{res} = \sum_{x \in \{a,b,c\}} I_{ps,x}^{res} \quad (14)$$

where, $I_{ps,x}^{res}$ is the residual current component of line segment between bus p and bus s contributed from phase x. And the residual currents contributed from each phase can also be represented as a vector, $I_{ps}^{res}$:

$$I_{ps}^{res} = \begin{bmatrix} I_{ps,a}^{res} \\ I_{ps,b}^{res} \\ I_{ps,c}^{res} \end{bmatrix}. \quad (15)$$

A backward sweep method can be used to determine the shunt caused residual current distribution in the feeder section. The method starts at the line segments connected with the last layer of the feeder section, then moves backward to next layer upstream, and ends at the line segments connected to the first layer of the section. For each line segment, the residual currents of a line segment at the downstream bus side is determined first based on the residual currents of downstream line segments, then the residual currents at the upstream bus side is determined by the values at the downstream side and the shunt currents contributed from the shunt admittances of the line segment.

For the example shown in FIG. 3, the backward sweep method starts from the line segments connected upstream to the last layer, layer 7 firstly, that is line segment between 380 and 390, 380 and 392, 386 and 394, and between 386 and 396. Then moving to line segments connected upstream to layer 6, including line segments between 370 and 380, 370 and 382, 374 and 384, 378 and 386, and between 378 and 388. The process is ending when the currents of switch between 330 and 340 connected upstream to layer 2 are determined.

Figure 5:
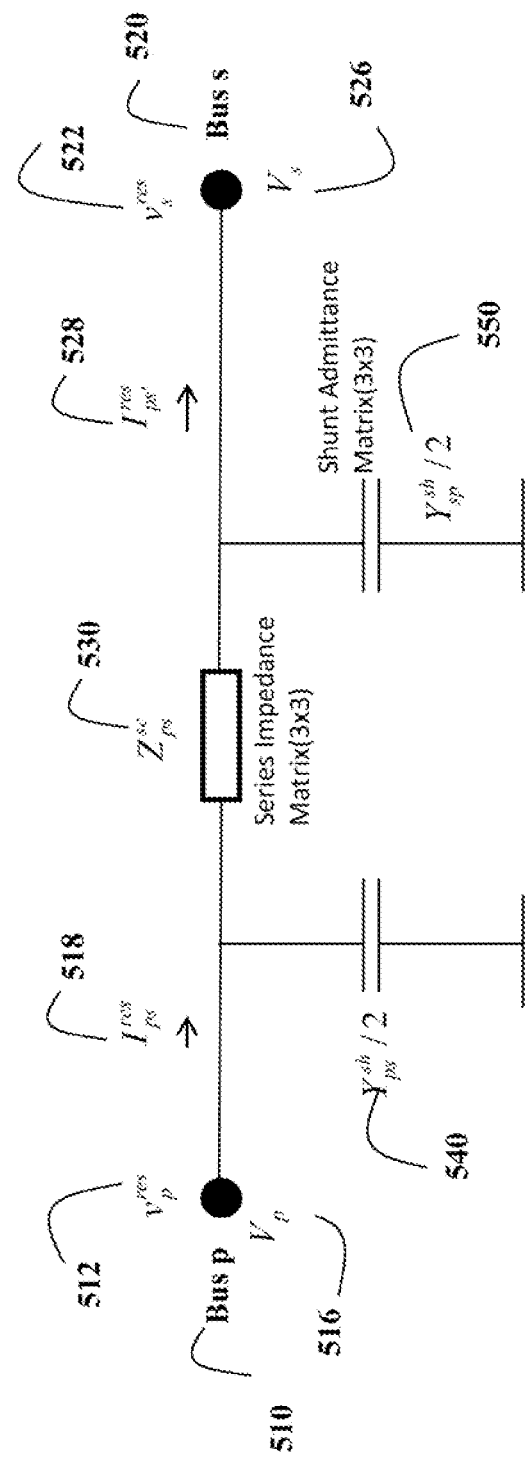
FIG. 5 is a schematic of a line segment with series impedance and shunt admittance.

FIG. 5 shows an example of a line segment 500 between a upstream bus p 510 and a downstream bus s, 520. The line segment is modeled by a series phase impedance matrix $Z_{ps}^{se}$ 530, and a shunt admittance matrix $Y_{ps}^{sh}$ partitioned into two terminal buses, 540, and 550. The phase-to-ground voltages at bus/2 and bus s are represented by the vectors $V_p$ 516 and $V_s$ 526, and the residual voltages at bus p and bus s are represented by the variables $v_p^{res}$ 512 and $v_s^{res}$ 522. The phase residual currents flowing on the line segments are represented by the vectors $I_{ps}^{res}$ 518 and $I_{ps'}^{res}$ 528, $I_{ps}^{res}$ 518 is the vector of residual currents entering into the line segment through bus p 510, and $I_{ps'}^{res}$ 528 is the vector of residual currents leaving from the line segment through bus s 520.

For a line segment connected an upstream bus p to a downstream bus s, the shunt caused residual current leaving the segment through the downstream bus s, $\hat{I}_{ps'}^{res}$ is determined as:

$$\hat{I}_{ps'}^{res} = \Sigma_{t \in DD_s} \hat{I}_{st}^{res} \quad (16)$$

where, $DD_s$ is the set of downstream buses that directly connected with bus s through a line segment or switch, and $\hat{I}_{st}^{res}$ is the vector of shunt caused residual currents flowing into a line segment between bus s and bus t through bus s. The shunt caused residual currents entering the segment between bus p and bus s through the upstream bus p is determined as:

$$\hat{I}_{ps}^{res} = \hat{I}_{ps'}^{res} + \tfrac{1}{2} Y_{ps}^{sh} (\hat{V}_p + \hat{V}_s) \quad (17)$$

where, $\hat{V}_p$ and $\hat{V}_s$ are the vectors of determined voltages of bus p and bus s.

For a switch connected an upstream bus p to a downstream bus s, Eq. (16) is used to determine the shunt caused residual currents at the downstream bus side, and the shunt caused residual currents at upstream bus side are set the same as the downstream one:

$$\hat{I}_{ps}^{res} = \hat{I}_{ps'}^{res} \quad (18)$$

If the downstream bus s of a line segment between bus p and s is an upstream bus of an exporting measuring device, then the shunt caused residual currents at the downstream bus side are determined based on the measurements at the exporting measuring device, and shunt currents downstream to the exporting device according to:

$$\hat{I}_{ps',x}^{res} = i_{ex}^{res} - \Sigma_{y \neq x, y \in \{a,b,c\}} \hat{I}_{ps',y}^{res}, \quad (19)$$

$$\hat{I}_{ps',y}^{res} = \Sigma_{mn \in DN_{ex}} \tfrac{1}{2} Y_{mn,y}^{sh} (\hat{V}_m + \hat{V}_n), \quad (20)$$

where, $\hat{I}_{ps',x}^{res}$ and $\hat{I}_{ps',y}^{res}$ are the shunt caused residual currents leaving the line segment between bus p and bus s through bus s on the faulty phase x, and one of un-faulty phase v, $i_{ex}^{res}$ is the residual current measurement at the exporting measuring device, $DN_X$ is the set of all line segments downstream to the exporting measuring device, $Y_{mn,y}^{sh}$ is the vector of shunt admittance elements of line segment between bus in and bus n at the row corresponding to the un-faulty phase v, $\hat{V}_m$ and $\hat{V}_n$ are the determined voltages of bus in and bus n.

Determining of Fault Caused Residual Current Distribution

If a fault is occurring downstream to a line segment, then the residual current of the faulty phase of the line segment is mainly contributed from the shunt currents on the un-faulty phases of the faulty feeder and adjacent feeders connected to the same substation transformer with the faulty feeder. This type of residual currents is called fault caused residual currents.

The fault caused residual currents can be determined for each line segment in the faulty section, and can be used to determine a corresponding fault caused voltage for determining the possible faulty line segments.

The distribution of fault caused residual currents are determined based on the residual current measurements at the root of the faulty section, the determined phase-to-ground voltages and shunt admittances of line segments through a forward sweep method. The faulted caused residual currents of line segments or devices are calculated by sequentially assuming a fault at the downstream terminal bus of a line segment or device, starting from the devices connected to the root of the feeder section and towards the ends of the feeder section.

Using FIG. 4 as an example, the method is started from the device connected downstream to bus 420 in the layer 1, switch 410 connected bus 420 to bus 430. Then moving on to the line segment connected to the bus of layer 2, i.e., the line segment between bus 430 and bus 440. This method ends when the residual current calculation for the line segments between layer 5 and layer 6 are completed.

For any line segment connecting an upstream bus p to a downstream bus s, the fault caused residual current entering the segment through the upstream bus p, $\tilde{I}_{ps}^{res}$ is determined according to:

$$\tilde{I}_{ps}^{res} = \tilde{I}_{dp'}^{res} - \Sigma_{t \in DD_p, t \neq s} \tilde{I}_{pt}^{res}, \quad (21)$$

where, $\tilde{I}_{dp'}^{res}$ is the fault caused residual current leaving an upstream line segment connected bus d to bus p through bus p, $DD_p$ is the set of buses downstream to bus p and having direct connection with bus p through a line segment or a switch, $\tilde{I}_{pt}^{res}$ the shunt caused residual current entering the line segment or switch between bus p and t through bus p.

The fault caused residual current leaving the line segment through bus s, $\tilde{I}_{ps'}^{res}$ can be determined as:

$$\tilde{I}_{ps'}^{res} = \tilde{I}_{ps}^{res} - \tfrac{1}{2} Y_{ps}^{sh} (\hat{V}_p + \hat{V}_s), \quad (22)$$

where, $\hat{V}_p$ and $\hat{V}_s$ are the determined voltages of bus p and bus s.

For a switch between bus p and bus s, Eq. (21) can be used to determine the fault caused residual currents at the upstream side, and then using those values to set the ones at downstream bus directly:

$$\hat{I}_{ps}^{res} = \tilde{I}_{ps}^{res}. \quad (23)$$

If the upstream bus of a line segment or switch between bus p and s is an upstream bus of an importing measuring device, the residual currents at the upstream bus side are determined based on the measurements at the importing device, and shunt currents downstream to the importing device according to:

$$\hat{I}_{ps,x}^{res} = i_{im}^{res} - \Sigma_{y \neq x, y \in \{a,b,c\}} \hat{I}_{ps,y}^{res}, \quad (24)$$

$$\hat{I}_{ps,y}^{res} = \Sigma_{mn \in DN_{im}} \tfrac{1}{2} Y_{mn,y}^{sh} (\hat{V}_m + \hat{V}_n), \quad (25)$$

where, $\tilde{I}_{ps,x}^{res}$ and $\tilde{I}_{ps,y}^{res}$ are the fault-caused residual currents entering the line segment between bus p and bus s through bus p on the faulty phase x, and one of un-faulty phase y, $i_{im}^{res}$ is the residual current measurements at the importing measuring device ini, $DN_{im}$ is the set of all line segments downstream to the importing measuring device im.

Determination of Faulty Line Segments

In some embodiments of the invention, the faulty line segment between an upstream and a downstream terminal buses is determined by comparing a first angle of an angle difference between angle of the fault caused residual voltage and the angle of the shunt caused residual voltage on the upstream bus and a second angle of the difference between an angle of the fault caused residual voltage and an angle of the shunt caused residual voltage on a downstream bus. For example, some embodiments compare the first and the second angles with a reference angle of the faulty phase. In these embodiments, the faulty segment is determined when the value of the reference angle of the faulty phase is between the values of the first and the second angles.

The fault caused residual voltages of terminal buses are determined based on the residual voltages and residual currents measured at the root of the faulty section, fault caused residual currents, and line series impedances and shunt admittances of line segments.

A forward sweep method can be used to determine the fault caused residual voltages for each line segment starting from the root of the feeder section towards to the end of the feeder section.

For any line segment connected an upstream bus p to a downstream bus s, the fault caused residual voltage at the downstream bus is determined based on the one at the upstream bus, and the fault caused current entering the line segment through the upstream bus according to:

$$\tilde{v}_s^{res} = \tilde{v}_p^{res} - T^T Z_{ps}^{se}(\tilde{I}_{ps}^{res} - \tfrac{1}{2} Y_{ps}^{sh} \hat{V}_p) \quad (26)$$

where, $\tilde{v}_s^{res}$ and $\tilde{v}_p^{res}$ are the fault caused residual voltage at bus s and bus p, T is a vector of unity defined as $T=[1\ 1\ 1]^T$, $\tilde{I}_{ps}^{res}$ is the vector of fault caused residual currents entering, the line segment though bus p, $\hat{V}_p$ is the vector of determined phase-to-ground voltages at bus p.

For any switch between bus p and bus s, the fault caused residua voltage at the downstream bus is set as the same as of the upstream bus:

$$\tilde{v}_s^{res} = \tilde{v}_p^{res} \quad (27)$$

The forward sweep method is starting from the upstream bus of importing measuring device at the root of the feeder section. The measured residual voltage is used to set the fault caused voltage at the bus of importing device:

$$\tilde{v}_{im}^{res} = v_{im}^{res} \quad (28)$$

where, $\tilde{v}_{im}^{res}$ is the fault caused residual voltage at upstream bus of importing device im, $v_{im}^{rea}$ is the residual voltage measured at importing device im during the fault.

The faulty line segment is identified by comparing the angles of the difference of fault caused residual voltage and shunt caused residual voltage for two terminal buses of the segment. If the angles at two terminal buses are located at different sides of a reference axis defined by a reference angle according to the faulty phase, then the line segment is determined to be a faulty segment.

In some embodiments, Eq (29) is used to determine whether a line segment has a fault:

$$\sin(\angle(\tilde{v}_p^{rea} - \hat{v}_p^{res}) - \theta_x^{ref}) \sin(\angle(\tilde{v}_s^{res} - \hat{v}_s^{res}) - \theta_x^{ref}) < 0, \quad (29)$$

where, $\angle(\tilde{v}_p^{res} - \hat{v}_p^{res})$ and $\angle(\tilde{v}_s^{res} - \hat{v}_s^{res})$ are the phase angle of the difference of fault caused and shunt caused residual voltages at bus p, and bus s respectively, and $\theta_x^{ref}$ is the reference angle determined by the faulty phase.

In some embodiments, the reference angle of the faulty phase is set as the phase angle of internal voltage of equivalent infinite source for transmission systems fed to the substation. For example, the reference angle can be set as 0, −120 or 120 degree if the faulty phase is phase a, phase b, or phase c respectively.

Figure 6:
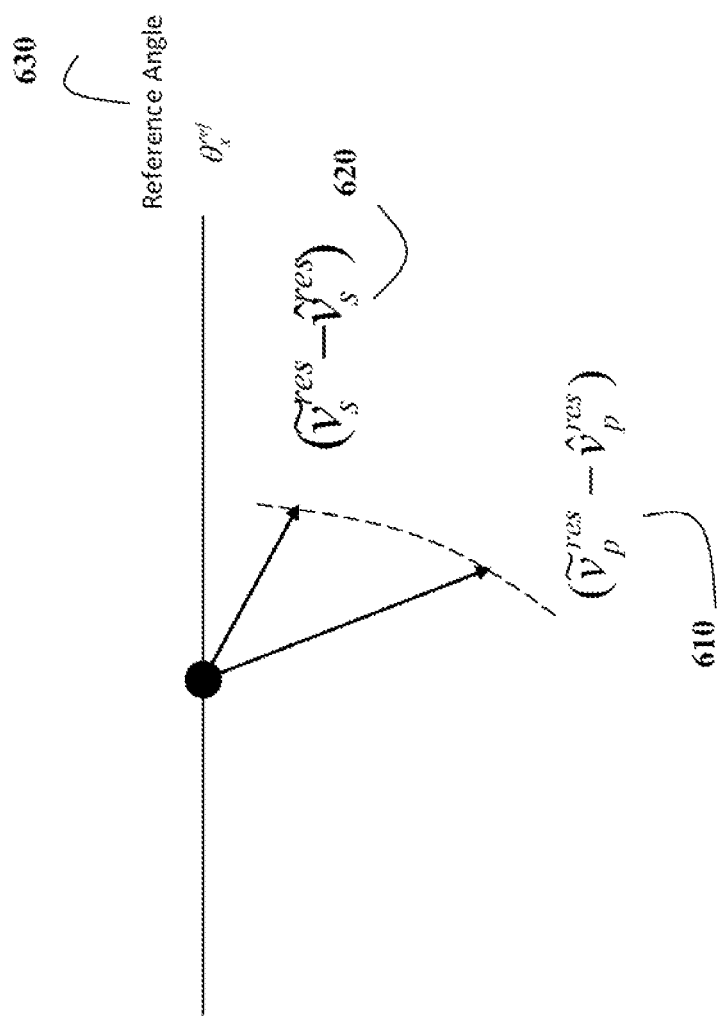
FIG. 6 is a schematic of a phasor diagram with phase angles of residua voltage differences at terminal buses of a line segment lagging the faulty phase reference angle.
Figure 7:
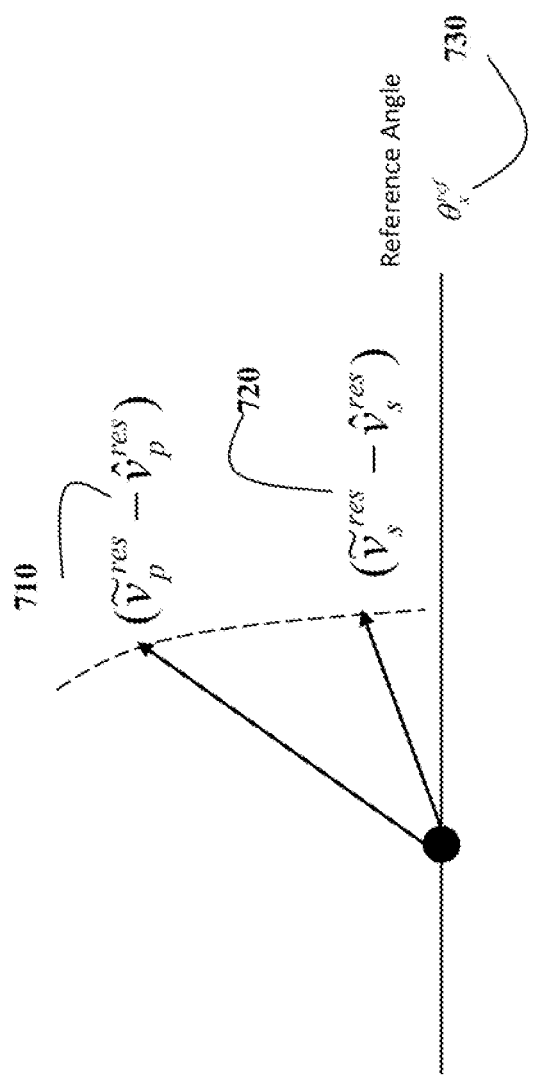
FIG. 7 is a schematic of a phasor diagram with phase angles of residual voltage differences at terminal buses of a line segment leading the faulty phase reference angle.
Figure 8:
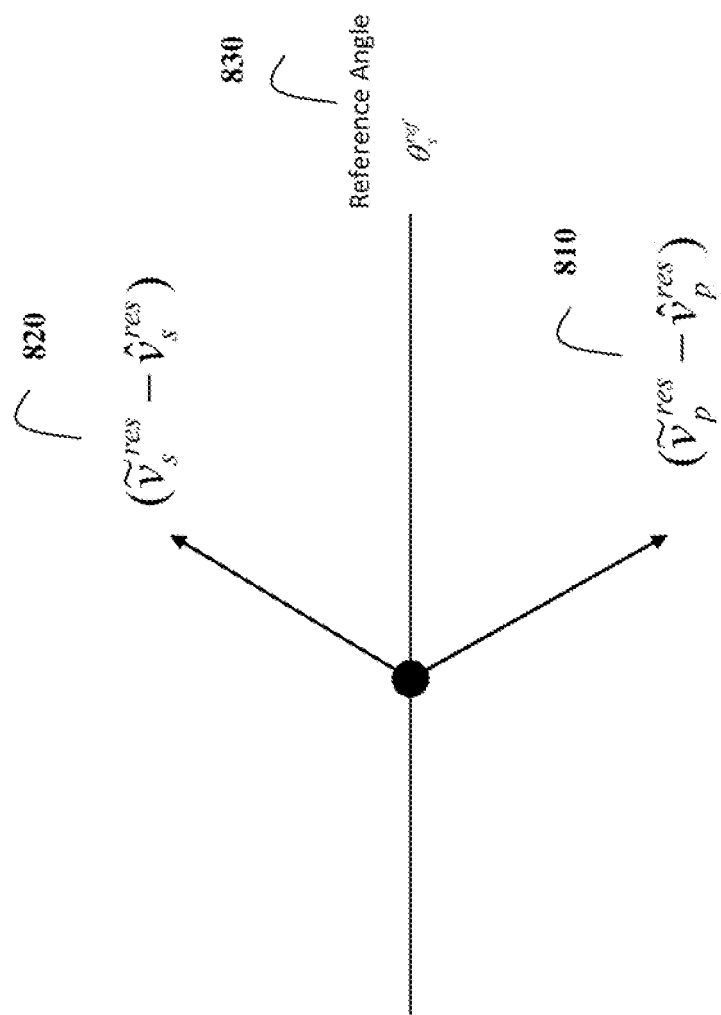
FIG. 8 is a schematic of a phasor diagram with phase angles of residual voltage differences at terminal buses of a line segment leading the faulty phase reference angle at one terminal bus, and lagging at other terminal bus.

FIGS. 6, 7 and 8 show three examples of phasor diagrams for residual voltage differences at terminal buses of a line segment.

In FIG. 6, both the angles of the fault-caused and shunt-caused residual voltage differences at terminal bus p and bus s, i.e., the first angle 610 and the second angle 620 are lagging the reference angle of the faulty phase $\theta_x^{ref}$ 630. Thus, for the line segments shown in FIG. 6, there is no fault occurring within the segments.

Similarly as; shown in FIG. 7, the angles of the fault-caused and shunt-caused residual voltage differences at terminal bus p and bus i.e., the first angle 710 and the second angle 720 are leading the reference angle of the faulty phase $\theta_x^{ref}$ 730. Thus, for the line segments shown FIG. 7, there is no fault occurring within the segments.

In FIG. 8, the angle of the fault-caused and shunt-caused residual voltage difference at bus p, 810 is lagging the reference angle of the faulty phase $\theta_x^{ref}$ 830, and the angle of the fault-caused and shunt-caused residual voltage difference at bus s, 820 is leading the reference angle of the faulty phase $\theta_x^{ref}$, 830. So, there is possibly a fault occurring at the line segment.

Determination of Fault Location Based on Residual Voltages

After the faulty line segments are determined, the possible faulty locations along each line segment can be determined according the difference of the angle of fault caused residual voltage and the angle of shunt caused residual voltage.

Specifically, the difference between the fault caused residual voltage and the shunt caused residual at the location of the fault is in phase with a reference angle of the faulty phase. Thus, various location, of the faulty line segment can be tested with this equality to determine the location of the fault.

Figure 9:
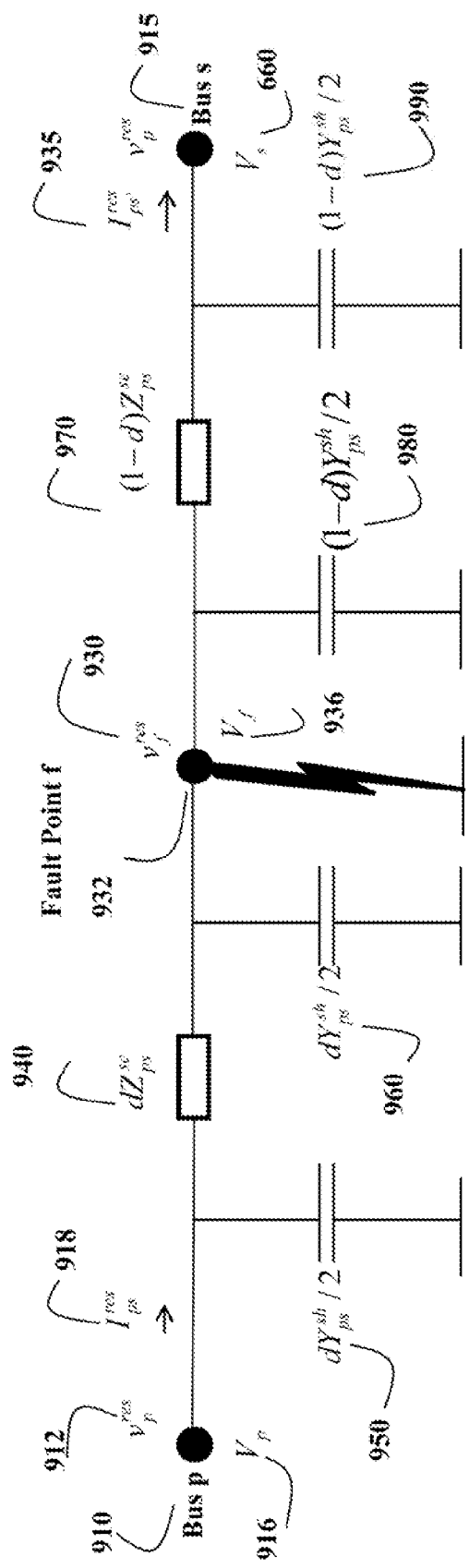
FIG. 9 is a schematic of a line segment with a single-phase-to-ground fault.

FIG. 9 shows a model of a line segment with a phase-to-ground fault. The line, segment 900 connects an upstream bus p 910 to a downstream bus s 915, and is partitioned into two subsegments according to the location of the fault f 932. The first segment is between bus p 910 and the location of fault f 932, and the second segment is between location of the fault f 932 and bus s 915.

For a ratio d of the distance between the fault location f 932 and the upstream bus p 910 over total length of the line segment between bus p 910 and bus s 915, the first segment can be modeled with a series impedance $dZ_{ps}^{se}$, 940 and a shunt admittance $dY_{ps}^{sh}$ partitioned into two terminal buses, 950 and 960, and the second segment can be modeled with a series impedance $(1-d)Z_{ps}^{se}$, 970 and a shunt admittance $(1-d)Y_{ps}^{sh}$ partitioned into terminal buses 980 and 990.

Based on the series impedance and shunt impedance model for the first segment between bus p and fault point f, the fault caused residual voltage can be calculated as:

$$\tilde{v}_f^{res} = \tilde{v}_p^{res} - dT^T Z_{ps}^{se}\left(\tilde{I}_{ps}^{res} - \frac{d}{2} Y_{ps}^{sh} \hat{V}_p\right), \quad (30)$$

where $\tilde{v}_f^{res}$ is the fault caused residual voltage at the location f, $\tilde{v}_p^{res}$ and $\tilde{I}_{ps}^{rea}$ are the fault caused residual voltage at upstream bus p, and the vector of fault caused residual currents entering the line segment through bus p, and $\hat{V}_p$ is the vector of determined phase-to-ground voltages of bus p.

Similarly based on the series impedance and shunt impedance model for the second segment between fault location f and bus s, the shunt caused residual voltage can be calculated as:

$$\hat{v}_f^{res} = \hat{v}_s^{res} + (1-d)T^T Z_{ps}^{se}\left(\tilde{I}_{ps'}^{res} + \frac{1-d}{2} Y_{ps}^{sh} \hat{v}_s\right), \quad (31)$$

where, $\hat{v}_f^{res}$ and $\hat{v}_s^{rea}$ are the shunt caused residual voltages at fault location f and downstream bus s, $\hat{I}_{ps'}^{res}$ is the vector of shunt-caused residual currents leaving the line segment through bus s, $\hat{V}_s$ is the vector of determined phase-to-ground voltages of bus s.

Some embodiments compare the angle of the difference of fault caused residual voltages and shunt caused residual voltages with the reference angle corresponding to the faulty phase. If those angles are close enough, then the fault is located at the location f.

For example, some embodiments use Eq. (32) to determine whether a location f is faulty:

$$|(\tilde{v}_f^{res}-\hat{v}_f^{res})-\theta_x^{ref}|<\epsilon, \qquad (32)$$

where, $\epsilon$ is a small threshold, such as 0.00001.

Figure 10:
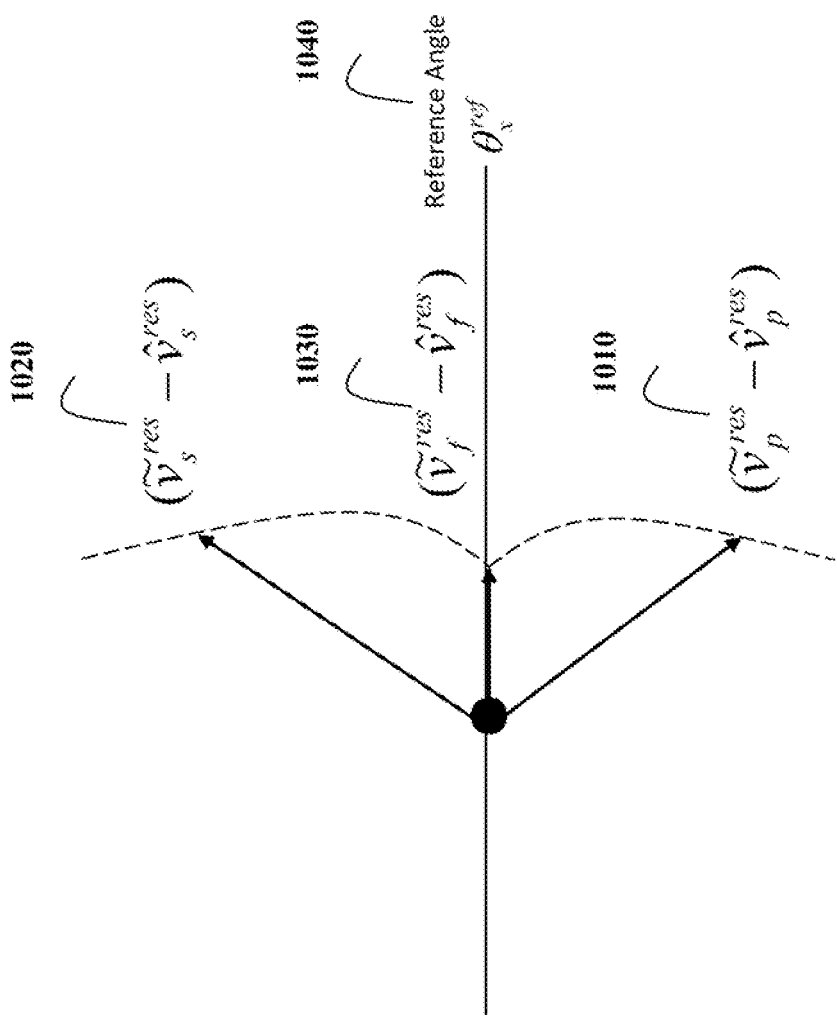
FIG. 10 is a schematic of a phasor diagram with phase angles of residual voltage differences at a location along a line segment in phase with the faulty phase reference angle.

FIG. 10 shows an example of phasor diagram for a location f within a line segment between the bus p and the bus s that having a phase angle of residual voltage differences in phase with the faulty phase based reference angle. This location f can be determined possibly having a bolted single-phase-to-ground fault at the faulty phase.

As shown in FIG. 10, the difference of fault-caused and shunt-caused residual voltages at bus p, 1010 lags the reference angle axis 1040, the difference of residual voltages at bus s, 1020 leads the reference angle axis 1040, and the difference of residual voltages at the location f, 1030 is in phase with the reference angle axis 1040.

EXAMPLE

Figure 11:
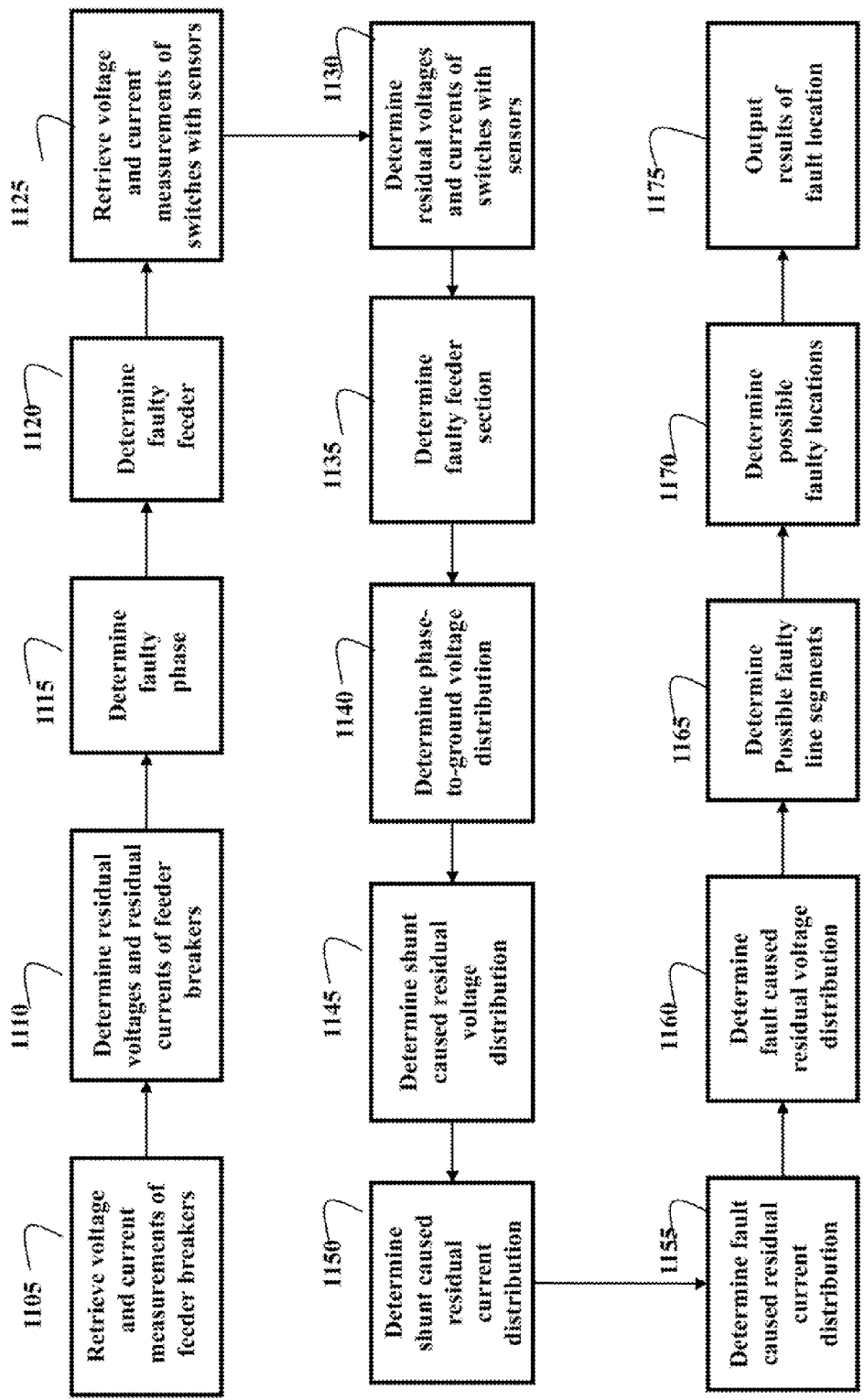
FIG. 11 is a block diagram of a fault locating method for a model of an ungrounded distribution system according to some embodiments of the invention.

FIG. 11 shows a block diagram of a method for locating a bolted single-to-ground fault of an ungrounded distribution system according to one embodiment of the invention. Various embodiments of invention use at least part of the steps of the method 1100.

In step 1105, the phase-to-ground voltage and phase current measurements at the feeder breakers of feeders in the substation are determined, e.g., retrieved from the measurement units.

In step 1110, the residual voltage and residual current of the feeder breaker for each feeder in the substation are determined.

In step 1115, the faulty phase is determined by comparing the magnitudes of phase-to-ground voltage measurements of a feeder breaker with the upper and the lower thresholds.

In step 1120, the faulty feeder is determined by comparing the phase angle difference between residual voltage and residual current of the feeder breaker for each feeder in the substation.

In step 1125, the phase-to-ground voltages and phase current measurements are determined, e.g., received, for the switches with sensors along the faulty feeder.

In step 1130, the residual voltages and residual currents for the switches with sensors along the faulty feeder are determined.

In step 1135, the faulty feeder section of the faulty feeder is determined, by comparing the phase angle difference between residual voltages and residual currents for the feeder breaker, and the switches with sensors along the faulty feeder.

In step 1140, the phase-to-ground voltage distribution of the faulty feeder section is determined based on the phase-to-ground voltage measurements at the feeder breaker or switches and feeder topology connectivity.

In step 1145, the shunt caused residual voltage distribution of the faulty feeder section is determined based on the determined phase-to-ground voltages.

In step 1150, determine the shunt caused residual current distribution of line segments within the faulty feeder section using a backward sweep method. The method starts from the line segments connected to the ends of the section towards the root of the section based on determined phase-to-ground voltages and shunt admittances of line segments.

In step 1155, determine the fault caused residual current distribution of line segments in the faulty feeder section using a forward sweep method. The sweep method starts from the line segments connected to the root of the section towards the ends of the section based on the residual current measurements at the root of the section, shunt caused residual currents determined in step 1150, and shunt admittances of line segments.

In step 1160, determine the fault caused residual voltage distribution of line segments in the faulty feeder section, starting from the root of the faulty feeder section towards the ends of the section based on the residual voltages measured at the root of the section, fault Caused residual currents determined in step 1155, shunt caused residual currents in step 1150, and series impedance and shunt admittance of line segments.

In step 1165, determine the possible faulty line segments by comparing the angle changes for the difference of the fault caused residual voltage, and the shunt caused residual voltage between two terminal buses of each line segment.

In step 1170, determine the possible fault location for each possible faulty line segment by finding a location along the line segment that has a angle of the difference between the fault caused residual voltage and the shunt caused residual voltage equals to a reference angle corresponding to the faulty phase.

In step 1175, output the fault locating results, including faulty phase, faulty feeder, faulty feeder section, possible faulty line segments, and possible geographic locations of faulty locations to the distribution automation systems.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

The invention claimed is:

1. A method for determining a location of a fault in an ungrounded power distribution system, wherein the power distribution system includes a set of feeders connected to a substation, wherein each feeder includes a set of loads connected by line segments and each line segment includes an upstream bus and a downstream bus, and the fault is a bolted single-phase-to-ground fault, comprising:
   determining shunt caused residual voltages on the upstream bus and the downstream bus of the line segment within a faulty feeder section of a faulty feeder;
   determining fault caused residual voltages on the upstream bus and the downstream bus of the line segment;
   designating the line segment as a faulty line segment when a reference angle of a faulty phase is between a first angle of a difference between an angle of the fault caused residual voltage and an angle of the shunt caused residual voltage on the upstream bus and a second angle of a difference between an angle of the fault caused residual voltage and an angle of the shunt caused residual voltage on the downstream bus; and
   determining a location of a point on the faulty line segment with a difference between the angle of the fault caused residual voltage and the angle of the shunt caused residual voltage in phase with the reference angle of the faulty phase as the location of the fault, wherein steps of the method are performed by a processor.

2. The method of claim 1, further comprising:
   determining a shunt caused residual voltage distribution and a fault caused residual voltage distribution on the faulty feeder section using voltages and currents measured for feeder breakers at roots of the feeders, and voltages and currents measured for switches with sensors along the feeders during the fault;

determining the shunt caused residual voltages on the upstream bus and the downstream bus of the line segment using the shunt caused residual voltage distribution; and determining the fault caused residual voltages on the upstream bus and the downstream bus of the line segment using the fault caused residual voltage distribution.

3. The method of claim 1, further comprising:
determining the reference angle of the faulty phase as an internal phase angle of an equivalent infinite source fed into a substation of the ungrounded power distribution system at the faulty phase.

4. The method of claim 1, further comprising:
comparing phase-to-ground voltages measured at roots of each feeder in the set of feeders with lower and upper thresholds to determine the faulty phase;
comparing a difference between an angle of a residual voltage and an angle of a residual current measured at a root of each feeder from the set of feeders with a angle threshold to determine the faulty feeder; and
comparing a difference between an angle of a residual voltage and an angle of a residual current measured at boundaries of each feeder section of the faulty feeder with the angle threshold to determine the faulty feeder section.

5. The method of claim 1, further comprising:
determining the shunt caused residual voltage for each bus in the faulty feeder section as a sum of phase-to-ground voltages for all phases at the bus.

6. The method of claim 5, wherein the phase-to-ground voltages for each bus in the faulty feeder section are determined based on voltages measured at the boundaries of faulty feeder section and lengths of each line segment in the faulty feeder section, further comprising:
determining voltages of boundary buses at the boundaries of the faulty feeder section using measurements provided by an importing measuring device and an exporting measuring device;
determining a voltage of a bus on a path between the boundary buses as a weighted average of the voltages of the boundary buses weighted proportionally to relative distances between the bus on the path and the boundary buses; and
determining a voltage of a bus not on the path as a voltage of a feeding bus on the path.

7. The method of claim 1, further comprising:
determining shunt caused residual currents on each phase of line segments of the faulty feeder section by accumulating shunt currents generated from shunt admittances of the line segments, wherein the accumulating is performed sequentially for each line segment in an upstream direction starting from a line segment connected to the end of the faulty feeder section and moving towards the root of the faulty feeder section.

8. The method of claim 7, further comprising:
initializing the shunt caused residual currents on each phase at the exporting measuring devices of the faulty section with the residual currents measured at the exporting devices, and shunt currents on the un-faulty phases generated by shunt admittances of all line segments downstream to the exporting devices and determined based on the phase-to-ground voltages of buses of the line segments.

9. The method of claim 1, further comprising:
determining fault caused residual currents for line segments in the faulty feeder section by sequentially assuming a fault downstream to the line segment starting from a line segment connected to a root of the faulty feeder section and moving towards the end of the feeder section.

10. The method of claim 9, further comprising:
initializing the faulted caused residual currents on each phase of a device connected to a importing measuring device of the faulty feeder section with the residual current measured for the importing device, and shunt currents on the un-faulty phases generated by shunt admittances of all line segments downstream to the importing devices.

11. The method of claim 9, further comprising:
determining fault caused residual currents for the faulty phase and un-faulty phases of a line segment separately based on a difference of a fault caused residual current on an upstream line segment and the shunt caused residual currents on adjacent line segments and the shunt currents generated by the shunt admittance of the line segment.

12. The method of claim 1, further comprising:
determining the fault caused residual voltages of the the upstream bus and the downstream bus of the line segment in the faulty feeder section by sequentially assuming a fault downstream to the line segment starting from a line segment connected to a root of the faulty feeder section and moving towards the end of the feeder section.

13. The method of claim 12, further comprising:
determining the fault caused residual voltages of the downstream bus of a line segment based on the fault caused residual voltage at the upstream bus of the line segment and the fault caused residual currents for each phase by using a series impedance and a shunt admittance of the line segment.

14. The method of claim 1, further comprising:
determining the faulty line segment when the reference angle is between the first angle and the second angle according to $$\sin(\angle(\tilde{v}_p^{res}-\hat{v}_p^{res})-\theta_x^{ref})\sin(\angle(\tilde{v}_s^{res}-\hat{v}_s^{res})-\theta_x^{ref})<0,$$

where, $\angle(\tilde{v}_p^{res}-\hat{v}_p^{res})$, is the first angle, $\angle(\tilde{v}_s^{res}-\hat{v}_s^{res})$ is the second angle, $\theta_x^{ref}$ is the reference angle determined by the faulty phase, $\tilde{v}_s^{res}$ and $\tilde{v}_p^{res}$ are the fault caused residual voltage at the downstream bus s and the upstream bus p, and $\hat{v}_s^{res}$ and $\hat{v}_p^{res}$ are the shunt caused residual voltage at the downstream bus s and the upstream bus p.

15. The method of claim 1, further comprising:
determining the location of the fault by testing locations along the faulty line segment according to $$|\angle(\tilde{v}_f^{res}-\hat{v}_f^{res})-\theta_x^{ref}|<\epsilon,$$

wherein $\epsilon$ is a threshold, $\hat{v}_f^{res}$ is a shunt caused residual voltage at the location f of the fault, $\tilde{v}_f^{res}$ is a fault caused residual voltage at the location f of the fault.

16. The method of claim 1, further comprising:
determining the fault caused residual voltage at a location of a point on the faulty line segment based on the fault caused residual voltage and current at the upstream bus of the line segment, and a series impedance and a shunt admittance of a portion of line segment from the upstream bus of the line segment to the location of the point.

17. The method of claim 1, further comprising:

determining the shunt caused residual voltages at a location of a point on the faulty line segment based on the residual voltage and the residual current for each phase at the downstream terminal bus of the line segment, and a series impedance and a shunt admittance of a portion of line segment from the location of the point to the downstream terminal bus.

18. A system for determining a location of a fault in an ungrounded power distribution system, wherein the power distribution system includes a set of feeders connected to a substation, wherein each feeder includes a set of loads connected by line segments and each line segment includes an upstream bus and a downstream bus, and the fault is a bolted single-phase-to-ground fault, comprising a processor for:

determining shunt caused residual voltages on the upstream bus and the downstream bus of the line segment within a faulty feeder section of a faulty feeder;

determining fault caused residual voltages on the upstream bus and the downstream bus of the line segment;

determining a faulty line segment as a line segment with a value of a reference angle of a faulty phase between a first angle and a second angle, wherein the first angle equals a difference between an angle of the fault caused residual voltage and an angle of the shunt caused residual voltage on the upstream bus, and wherein the second angle equals a difference between an angle of the fault caused residual voltage and an angle of the shunt caused residual voltage on the downstream bus; and determining a location of a point on the faulty line segment with a difference between the angle of the fault caused residual voltage and the angle of the shunt caused residual voltage in phase with the reference angle of the faulty phase as the location of the fault.

* * * * *